United States Patent
Routama et al.

(10) Patent No.: US 7,816,993 B2
(45) Date of Patent: Oct. 19, 2010

(54) TEMPERATURE COMPENSATED CRYSTAL OSCILLATOR

(75) Inventors: Jarkko Routama, Espoo (FI); Klaus Turhanen, Muijala (FI)

(73) Assignee: Micro Analog System Oy, Espoo (FI)

( * ) Notice: Subject to any disclaimer, the term of this patent is extended or adjusted under 35 U.S.C. 154(b) by 0 days.

(21) Appl. No.: 11/984,970

(22) Filed: Nov. 26, 2007

(65) Prior Publication Data

US 2008/0106348 A1    May 8, 2008

Related U.S. Application Data

(63) Continuation of application No. 11/296,373, filed on Dec. 8, 2005, now Pat. No. 7,403,078.

(30) Foreign Application Priority Data

Dec. 22, 2004    (FI) .................................. 20045500

(51) Int. Cl.
    *G01K 7/21* (2006.01)
    *G01K 7/25* (2006.01)
(52) U.S. Cl. .................... 331/158; 331/66; 331/176

(58) Field of Classification Search ................ 331/66, 331/176, 158
See application file for complete search history.

(56) References Cited

U.S. PATENT DOCUMENTS

| | | | |
|---|---|---|---|
| 5,757,244 A | 5/1998 | Nonaka et al. | |
| 5,986,515 A | 11/1999 | Sakurai | |
| 6,476,682 B1 | 11/2002 | Cole et al. | |
| 6,629,342 B1 * | 10/2003 | Tanaka et al. | 29/25.35 |

* cited by examiner

*Primary Examiner*—Robert Pascal
*Assistant Examiner*—James E Goodley
(74) *Attorney, Agent, or Firm*—Oliff & Berridge, PLC

(57) ABSTRACT

The present invention relates to an integrated circuit for a temperature compensated crystal oscillator having an external crystal. The integrated circuit comprises a temperature compensation having one fixed or at least two selectable $3^{rd}$ and/or $4^{th}$ and/or $5^{th}$ and/or higher order temperature compensation functions for at least one specific type of external crystal. The temperature compensation can be calibrated at one temperature, in other words without use of temperature variation, by means of an external voltage or current source overdriving a respective temperature-dependent voltage or current supplied from an internal temperature sensor to the temperature compensation.

7 Claims, 2 Drawing Sheets

TEMPERATURE COMPENSATED CRYSTAL OSCILLATOR

This is a Continuation of application Ser. No. 11/296,373 filed Dec. 8, 2005. The disclosure of the prior application is hereby incorporated by reference herein in its entirety.

BACKGROUND

The invention relates to temperature compensated crystal oscillators.

Crystal oscillators (XO) are widely used in electronics as highly stable and accurate frequency sources. In a voltage controlled crystal oscillator (VCXO) the nominal oscillation frequency is adjustable in response to a voltage control input. The frequency accuracy of the crystal oscillators is affected by many variables, some of which are temperature, aging, drive level, retrace and vibration. As illustrated in FIG. 1, normal quartz crystal has quite large temperature variations, which depend on the cutting angle of the crystal.

At many applications the requirements for the maximum temperature variations are much tighter than this variation, and therefore various temperature compensation methods have been developed. One way to achieve frequency stability is to thermally isolate the crystal and oscillator circuitry from ambient temperatures excursions. In an oven controlled crystal oscillator (OCXO) the crystal and other temperature sensitive components are in a stable oven (a small usually metallic, insulated enclosure) provided with a heating element and a control mechanism to regulate the amount of heat applied thereby maintaining a constant elevated temperature. However, the OCXOs have disadvantages, such as the space required for the oven.

A temperature compensated crystal oscillator (TCXO) and a voltage controlled temperature compensated crystal oscillator (VCTCXO) typically contain a temperature compensation circuit to sense the ambient temperature and control the crystal frequency in order to prevent the frequency drift over the temperature range.

As illustrated in FIG. 1, normal quartz crystal has quite large temperature variations, which depend on the cutting angle of the crystal. The problem is that present manufacturing methods of the TCXO modules require temperature variations for accurate temperature compensation result. Temperature variations requires expensive ovens, which increases the manufacturing time and costs of the TCXO modules. In the TCXO modules the temperature compensation function is implemented with an integrated circuit or discrete components, which typically have quite large manufacturing tolerances. This means that the TCXO module has to be measured at several temperatures to get the correct settings for the perfect compensation result.

SUMMARY

An object of the present invention is new temperature compensation and manufacturing method for crystal oscillators.

The invention is characterized by what is stated in the independent claims. The preferred embodiments of the invention are disclosed in the dependent claims.

An integrated circuit for a temperature compensated crystal oscillator having an external crystal. The integrated circuit comprises temperature compensation having one fixed or at least two selectable $3^{rd}$ and/or $4^{th}$ and/or $5^{th}$ and/or higher order temperature compensation functions for at least one specific type of external crystal, and means for calibrating the temperature compensation at one temperature without use of temperature variation. The specific type of external crystal means, for example, that if certain type of crystals is used for example with enough small manufacturing tolerances or crystals which has been measured at temperatures, the required temperature compensation function is known. If this compensation function is done with components or integrated circuit which have a fixed or selectable $3^{rd}$ and/or $4^{th}$ and/or $5^{th}$ order compensation gain matching to the crystal function and no temperature offset error, a temperature compensated crystal oscillator module does not require any other calculations or temperature variations. This means that a temperature compensated crystal oscillator module can be manufactured without the use of ovens, which reduces the manufacturing time and costs.

With integrated circuits the manufacturing variations usually has to be calibrated or otherwise the production yield is too low. This calibration can be done at either component testing or at a temperature compensated crystal oscillator module testing. The temperature measurement of the temperature compensation function may be done with some type of temperature sensor, which can be, but is not limited to, a resistor or PN-junction voltage. So the output of such sensor can be a voltage or a current which can be forced externally at the calibration to correspond to the test temperature. As a result, the temperature offset and/or $1^{st}$ and/or $3^{rd}$ and/or $4^{th}$ and/or $5^{th}$ order errors of the temperature compensation block can be measured and calibrated at one temperature.

BRIEF DESCRIPTION OF THE DRAWINGS

In the following the invention will be described in greater detail by means of preferred embodiments with reference to the attached drawings, in which.

DETAILED DESCRIPTION OF EMBODIMENTS

Figure 2:
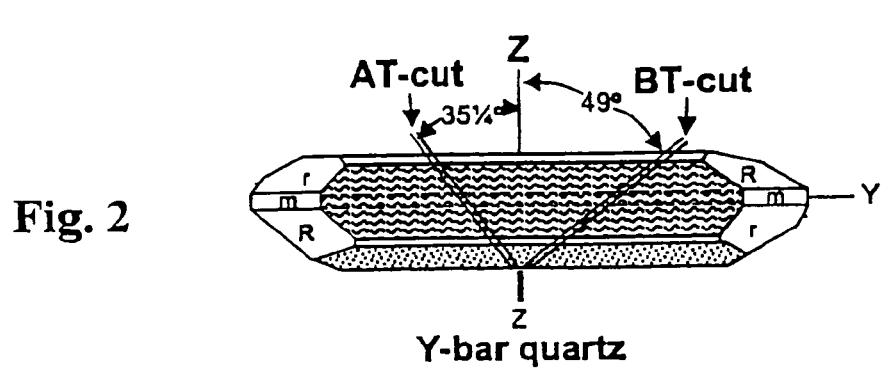
FIG. 2 shows the orientation of the X, Y, and Z-axis in crystal bar.

Because the physical properties of crystals vary with orientation, a reference orientation and measurement system is necessary. Several systems of axial orientation exist; however, the rectangular or orthogonal coordinate system is most commonly used to describe crystal piezoelectric and mechanical properties. In the rectangular coordinate systems, the Z-axis is parallel to the m prism faces. FIG. 2 shows the orientation of the X, Y, and Z-axis. A plate of quartz cut with its major surface perpendicular to the X-axis is called an X-cut plate. Rotating the cut 90 degrees about the Z-axis gives a Y-cut plate with the Y-axis now perpendicular to the major surface. Because a quartz crystal has six prism faces, three choices exist for the X and Y-axis. The selection is arbitrary; each behaves identically. The piezoelectric effect determines the sense, positive or negative, of the X and Y-axis. An x-cut plate under stress develops a positive charge on one side of the plate and an equal negative charge on the other side. Following the IEEE standard, a positive strain develops a positive charge on the positive X-face. In this convention, positive strain is defined as extension resulting from tension. Compression on the other hand, creates a negative strain, so the positive direction face of an X-cut plate under compression is negatively charged. Force applied in the wrong direction generates no charge. A Y-cut plate does not respond to Y-axis compression or tension but does respond to shear stress applied to its edge. Shear stress in a Y-cut plate translates to tension in the X direction.

Orientation of the cut with respect to the crystal axis determines not only value of the physical properties of the crystal, but also their temperature coefficient. Changing the crystal orientation by 90 degrees changes the frequency-temperature coefficient from negative to positive. Partway between the X-cut and Y-cut orientations, the coefficient goes through zero. Similarly, a partial rotation of a Y-cut plate about the X-axis yields two points of a zero frequency-temperature coefficient. These orientations are the AT and BT-cuts with rotation angles of approximately +35° and 49° respectively.

Figure 3:
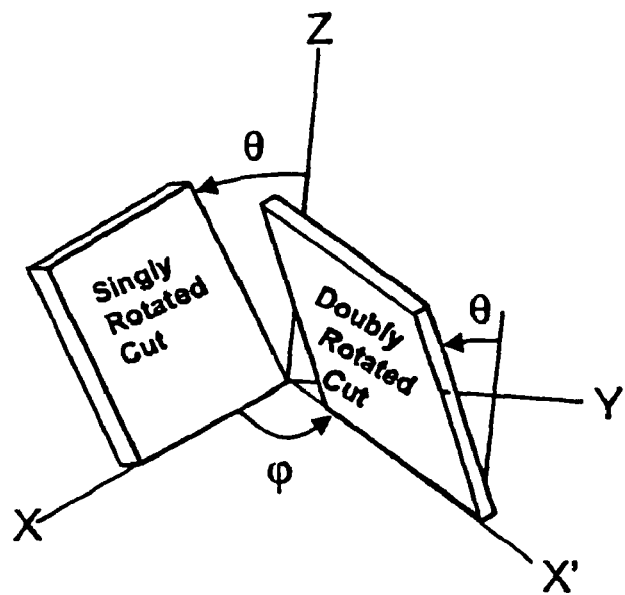
FIG. 3 shows simply-rotated cut and doubly-rotated cut in a rectangular coordinate system.

The lines sloping left from the x-axis mark the saw cut position for AT plates, the line sloping to the right indicates the BT-cut. Referring to FIG. 3, singly rotated cuts are framed by aligning the saw blade with the crystal X-Z plane (Y-cut) then rotating the blade about the X-axis to the desired angle θ. Preceding the X-axis rotation θ with a rotation Φ about the Z-axis as illustrated below in FIG. 3 produces a doubly rotated cut. The majority of crystals manufactured are AT-cuts, however, doubly rotated cuts, especially SC-cuts, are becoming increasingly popular in moderate and high precision applications.

Figure 1:
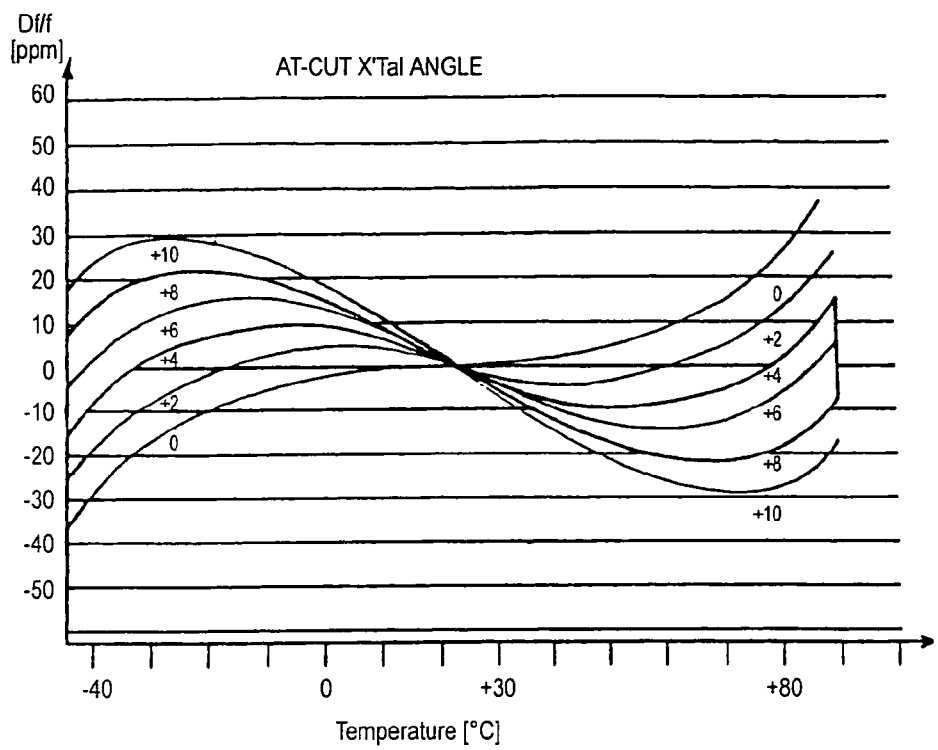
FIG. 1 shows quartz crystal temperature behavior with different cutting angles.

FIG. 1 gives the frequency-temperature curves for AT-cut fundamental crystals. Each curve represents a cut angle Δθ in relation to the basic AT cut (e.g. θ=35°20', Φ=0) and follows a cubic equation. Temperature coefficient, measured as frequency deviation in parts per million (ppm) per degree centigrade corresponds to the slope of the curve. At two points the temperature coefficient is zero. These points are the upper and lower turn points and they fall symmetrically about a point in the +20 to +30° C. range. Thus, when one turn point is located by selecting the crystal cut angle, the position of the other is also fixed. It is not possible to set the turn points independently. Since moving the turn points together reduces the slope between them, frequency stability is optimized for a given temperature range by selecting the crystal cut angle that places the turn points towards the ends of, or just beyond the expected temperature extremes. With the turn point axis of symmetry in the range of +20 to +30° C., excellent frequency stability can be achieved without compensation for modest temperature excursions about room temperature. Curve 0 in FIG. 1 is nearly flat throughout this range.

Quartz crystal temperature behavior can be modeled as follows:

$$dfT(T,a1,a3,a4,a5,Tinf):=a1\cdot(T-Tinf)+a3\cdot(T-Tinf)^3+a4\cdot(T-Tinf)^4+a5\cdot(T-Tinf)^5 \quad (1)$$

Where T=Temperature; a1, a3, a4, a5=coefficients for $1^{st}$, $3^{rd}$, $4^{th}$ and $5^{th}$ order temperature errors; Tinf=Temperature offset error, zero point of temperature curve derivative.

Figure 4:
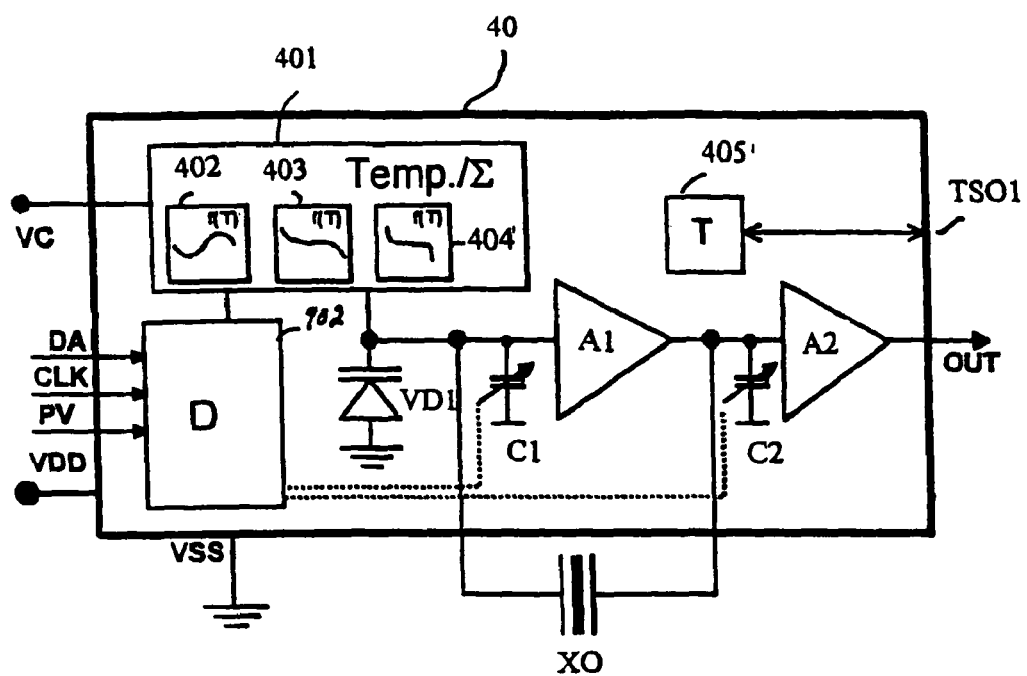
FIG. 4 shows an example of an oscillator according to the present invention.

FIG. 4 illustrates an example of a VCTCXO which implements the principles of the present invention. The oscillator 40 may be implemented as an integrated circuit well suited for various applications, such as the mobile phones and other telecommunications systems. Only a crystal X1 may be required as an additional external component. A resonant circuit includes differential amplifiers A1 and A2, the crystal X1, a varactor diode VD1, and the voltage controlled capacitances C1 and C2. A voltage control input VC receives a control voltage which is feed through a temperature compensation 401 to adjust the reverse voltage across the varactor VD1 and thereby the capacitance of VD1 and the resonant frequency of the resonant circuit. The temperature compensation 401 has a fixed or selectable $3^{rd}$ and/or $4^{th}$ and/or $5^{th}$ order compensation gain (i.e. coefficients a1, a2 and a3 in the equation 1 above) matching to frequency-temperature function of the crystal X1. The $3^{rd}$ and/or $4^{th}$ and/or $5^{th}$ order compensation functions are depicted with blocks 402, 403, and 404 in FIG. 4. The temperature compensation 401 has no temperature offset error compensation, i.e. the linear gain a1 in the equation 1. The compensation signals produced by the blocks 402, 403, and 404 are summed with the control voltage VC so as to achieve the actual, compensated control voltage. The ambient temperature measurement of the compensation block 401 is done with a temperature sensor 405. The temperature sensor 405 can be, but is not limited to, a resistor or PN-junction voltage, in which case the output of the sensor 405 to the either voltage or current. The oscillator circuit 40 is calibrated, programmed and controlled through a serial bus of a data block 402. The serial bus comprises a programming input PV, a serial bus clock input CLK and a serial bus data input DA.

With integrated circuits the manufacturing variations usually has to be calibrated or otherwise the production yield is too low. This calibration can be done at either component testing or at the TCXO module testing. The circuit 40 has internal temperature sensor 405, whose output TSO1 is temperature dependent voltage or current. At calibration situation the temperature changes are modeled with an external voltage or current source that is connected to the output pin TSO1 of the temperature sensor. Thereby the temperature sensor output TSO1 can be forced to some known voltages with an external voltage/current source. The integrated circuit 40 can be calibrated by measuring the compensation curve of the integrated circuit (e.g. the sum of all compensation terms) voltage or output frequency with some known TSO1 voltages. The required settings of the integrated circuit 40 can be calculated from these measurements so that circuit matches to some certain crystal parameters.

For example: The temperature offset of the integrated circuit 40 may be calibrated by measuring the compensation curve of the integrated circuit 40 at five TSOI1 points, such as default settings of an internal digital-analog converter (DAC). The internal DAC provides a linear tuning range for the temperature calibration. Thus, when the temperature offset error from the desired nominal value or default value is measured, the correct DAC setting can be calculated from the following equation:

$$DA\text{-setting}=(Default\ value)-(error/DAC\ step)$$

The compensation gain of the integrated circuit 40 can be calibrated by the same method. For example, the calibration can be performed by means of measuring the output frequency at two known TSO1 points. The frequency difference between these two points is then subtracted from the desired value or default value that depends on the crystal. Then the correct DAC setting can be calculated from the above equation. The DAC settings or other calculated calibration values are programmed in the data block 402 through the serial bus. The calibration of the TCXO module does not require any other calculations or temperature variations. Thus, the temperature offset and $1^{st}$ and/or $3^{rd}$ and/or $4^{th}$ and/or $5^{th}$ order errors of the temperature compensation block can be measured and calibrated at one temperature. This means that TCXO module can be manufactured without the use of ovens, which reduces the manufacturing time and costs.

Crystals for which the required temperature compensation function is known are used as the crystal X1, such as certain type of crystals with enough small manufacturing tolerances, or crystals which has been measured at temperatures. Advantageously, AT cut crystals with a cut angle of approximately 0 degrees, or within approximately ±1 degrees can be used. As can be seen in FIG. 1, the 0 degrees curve is nearly flat throughout in the range of +20 to +30° C., excellent frequency stability can be achieved without compensation for modest temperature excursions about room temperature. Thus, it is possible to perform accurate calibration in a room temperature, or more generally, less accurate ambient temperature is required for the calibration.

In case of the crystal being a AT cut crystal with a cut angle of approximately 0 degrees, the temperature compensation 401 may have a fixed, preprogrammed compensation function, e.g. fixed $3^{rd}$ and/or $4^{th}$ and/or $5^{th}$ order compensation gain blocks matching to the predetermined, known frequency-temperature function of the specific AT cut crystal with a cut angle of approximately 0 degrees. Thus, only the temperature offset and $1^{st}$ and/or $3^{rd}$ and/or $4^{th}$ and/or $5^{th}$ order errors of the temperature compensation block may be measured and calibrated at one temperature.

In case of selectable compensation functions, the temperature compensation 401 may have two or more fixed, preprogrammed compensation functions matching to the predetermined, known frequency-temperature functions of two or more different types of crystals. For example, the temperature compensation 401 may have a first fixed, preprogrammed compensation function for an AT cut crystal with a cut angle of approximately 0 degrees, a second fixed, preprogrammed compensation function for an AT cut crystal with a cut angle of approximately +1 degrees, and a third fixed, preprogrammed compensation function for an AT cut crystal with a cut angle of approximately +1 degrees. The manufacturer of the TCXO or VCTCXO can choose one of these crystal types for the oscillator and select the respective compensation function in the temperature compensation 401 through the serial bus during the calibration. The manufacturer has more freedom to select the crystal, while the calibration is still simple and can be performed at one temperature.

It will be obvious to a person skilled in the art that, as the technology advances, the inventive concept can be implemented in various ways. The invention and its embodiments are not limited to the examples described above but may vary within the scope of the claims.

What is claimed is:

1. An integrated circuit for a temperature compensated crystal oscillator having an external crystal, the circuit comprising
   a temperature compensator having a first selectable 3rd and/or 4th and/or 5th and/or higher order temperature compensation function for an AT-cut crystal with a cutting angle of approximately 0 degrees, a second selectable compensation function for an AT-cut crystal with a second cut angle within range of approximately ±1 degrees, and a third selectable compensation function for an AT-cut crystal with a third cut angle within range of approximately ±1 degrees, and
   calibrator circuitry for the temperature compensator, said calibrator circuitry being configured to a calibration procedure at one temperature without use of temperature variation.

2. An integrated circuit as claimed in claim 1, wherein said calibrator circuitry comprise means for calibrating a temperature offset error at one temperature without use of temperature variation.

3. An integrated circuit as claimed in claim 1, wherein said calibrator circuitry is configured to calibrate 1st and/or 3rd and/or 4th and/or 5th and/or higher order temperature errors at one temperature without use of temperature variation.

4. An integrated circuit as claimed in claim 1, wherein said calibrator circuitry is adapted to be used for calibration at component or module testing at one temperature.

5. An integrated circuit as claimed in claim 1, wherein a temperature offset error of said integrated circuit is pre-calibrated at component or module testing at one temperature using said calibration circuitry.

6. An integrated circuit as claimed in claim 1, wherein 1st and/or 3rd and/or 4th and/or 5th and/or higher order temperature errors of said compensator are pre-calibrated at component or module testing at one temperature by using said calibration circuitry.

7. An integrated circuit as claimed in claim 1, comprising a data input for programming and storing the calibration values obtained during the calibration.

\* \* \* \* \*